(12) United States Patent
Inoue

(10) Patent No.: US 7,626,620 B2
(45) Date of Patent: Dec. 1, 2009

(54) PHOTOELECTRIC CONVERSION UNIT STACKED STRUCTURE

(75) Inventor: Shunsuke Inoue, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 365 days.

(21) Appl. No.: 11/624,789

(22) Filed: Jan. 19, 2007

(65) Prior Publication Data

US 2007/0120991 A1 May 31, 2007

Related U.S. Application Data

(63) Continuation of application No. 10/406,950, filed on Apr. 3, 2003, now Pat. No. 7,215,368.

(30) Foreign Application Priority Data

Apr. 5, 2002 (JP) ............................ 2002/104030

(51) Int. Cl.
*H04N 3/14* (2006.01)

(52) U.S. Cl. ...................................... 348/272

(58) Field of Classification Search ................ 348/273, 348/275, 280, 277, 302, 308, 310, 272; 257/440
See application file for complete search history.

(56) References Cited

U.S. PATENT DOCUMENTS

| | | | |
|---|---|---|---|
| 4,677,289 A * | 6/1987 | Nozaki et al. .............. 250/226 |
| 4,922,334 A | 5/1990 | Hashimoto et al. | |
| 5,892,253 A | 4/1999 | Merrill | |
| 5,965,875 A * | 10/1999 | Merrill ...................... 250/226 |
| 6,137,100 A | 10/2000 | Fossum et al. | |
| 6,150,676 A * | 11/2000 | Sasaki ........................ 257/191 |
| 6,246,043 B1 | 6/2001 | Merrill | |
| 6,452,633 B1 | 9/2002 | Merrill et al. | |
| 6,521,926 B1 | 2/2003 | Sasaki | |
| 6,566,723 B1 * | 5/2003 | Vook et al. .................. 257/440 |
| 6,593,558 B1 * | 7/2003 | Edgar ...................... 250/208.1 |
| 6,600,160 B2 | 7/2003 | Kobayashi et al. | |
| 6,606,120 B1 * | 8/2003 | Merrill et al. ................ 348/273 |
| 6,632,701 B2 * | 10/2003 | Merrill ...................... 438/70 |
| 6,731,397 B1 | 5/2004 | Merrill et al. | |
| 6,741,283 B1 | 5/2004 | Merrill et al. | |
| 6,794,627 B2 | 9/2004 | Lyon et al. | |
| 6,934,050 B2 | 8/2005 | Merrill et al. | |
| 7,215,368 B2 * | 5/2007 | Inoue ........................ 348/273 |
| 2002/0171881 A1 | 11/2002 | Merrill et al. | |

(Continued)

FOREIGN PATENT DOCUMENTS

| | | |
|---|---|---|
| JP | 05-207376 | 8/1993 |
| JP | 06-052802 | 7/1994 |
| JP | 2001-197367 | 7/2001 |
| WO | WO99/56097 | 11/1999 |

*Primary Examiner*—Jason Chan
*Assistant Examiner*—Nicholas G Giles
(74) *Attorney, Agent, or Firm*—Fitzpatrick, Cella, Harper & Scinto

(57) ABSTRACT

In a photoelectric conversion device having a plurality of pixel circuits, a read transistor, a main electrode of which is connected to a charge accumulation node of a photoelectric conversion unit in each pixel circuit is operated in a pentode region, so as to read out a photoelectric conversion signal of each diode to a floating diffusion.

4 Claims, 18 Drawing Sheets

U.S. PATENT DOCUMENTS

| | | |
|---|---|---|
| 2003/0169359 A1 | 9/2003 | Merrill et al. |
| 2003/0193011 A1 | 10/2003 | Takeda |
| 2003/0193586 A1 | 10/2003 | Hayakawa |
| 2003/0193590 A1 | 10/2003 | Hirai |
| 2004/0080638 A1 | 4/2004 | Lee |
| 2004/0125222 A1 | 7/2004 | Bradski et al. |

* cited by examiner

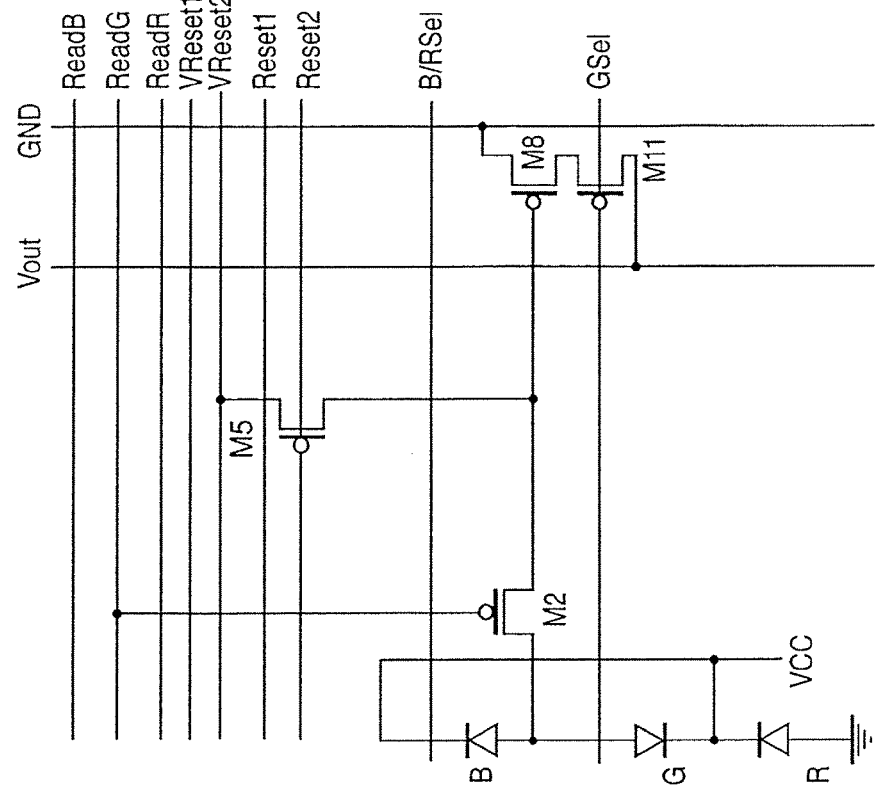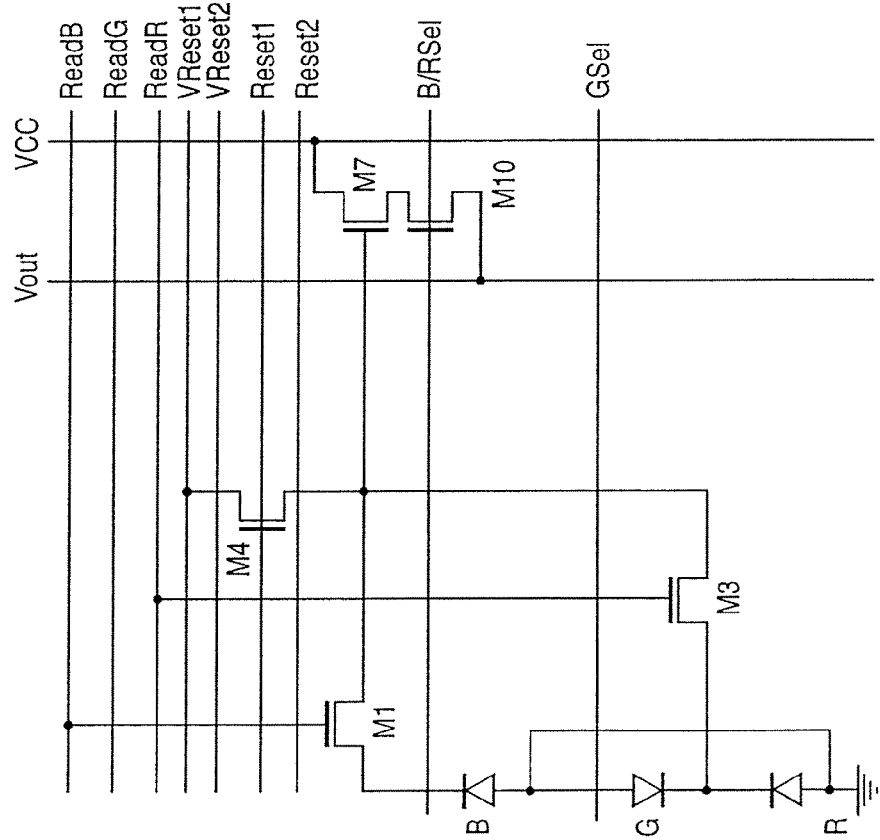
FIG. 14A
FIG. 14B

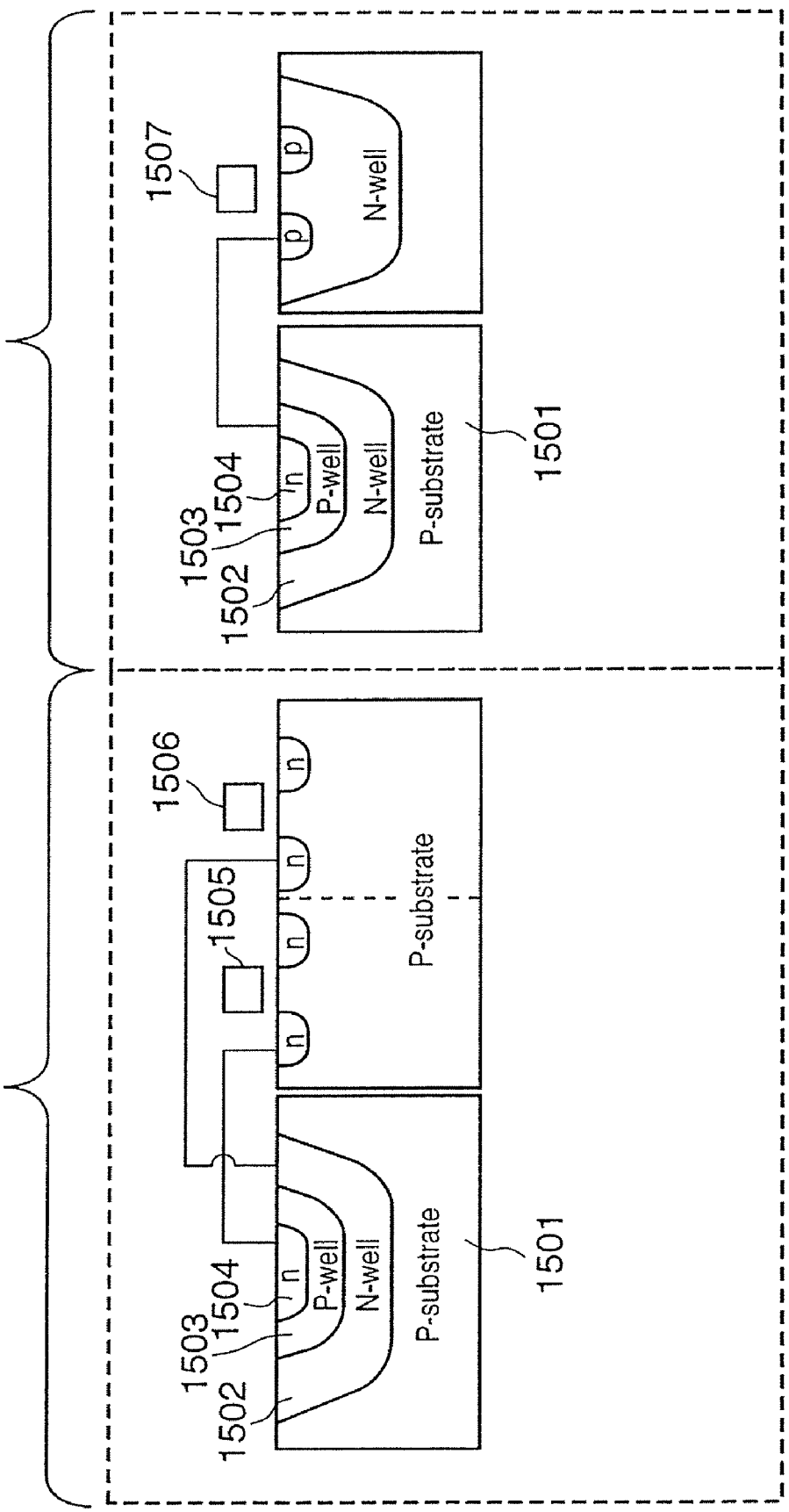

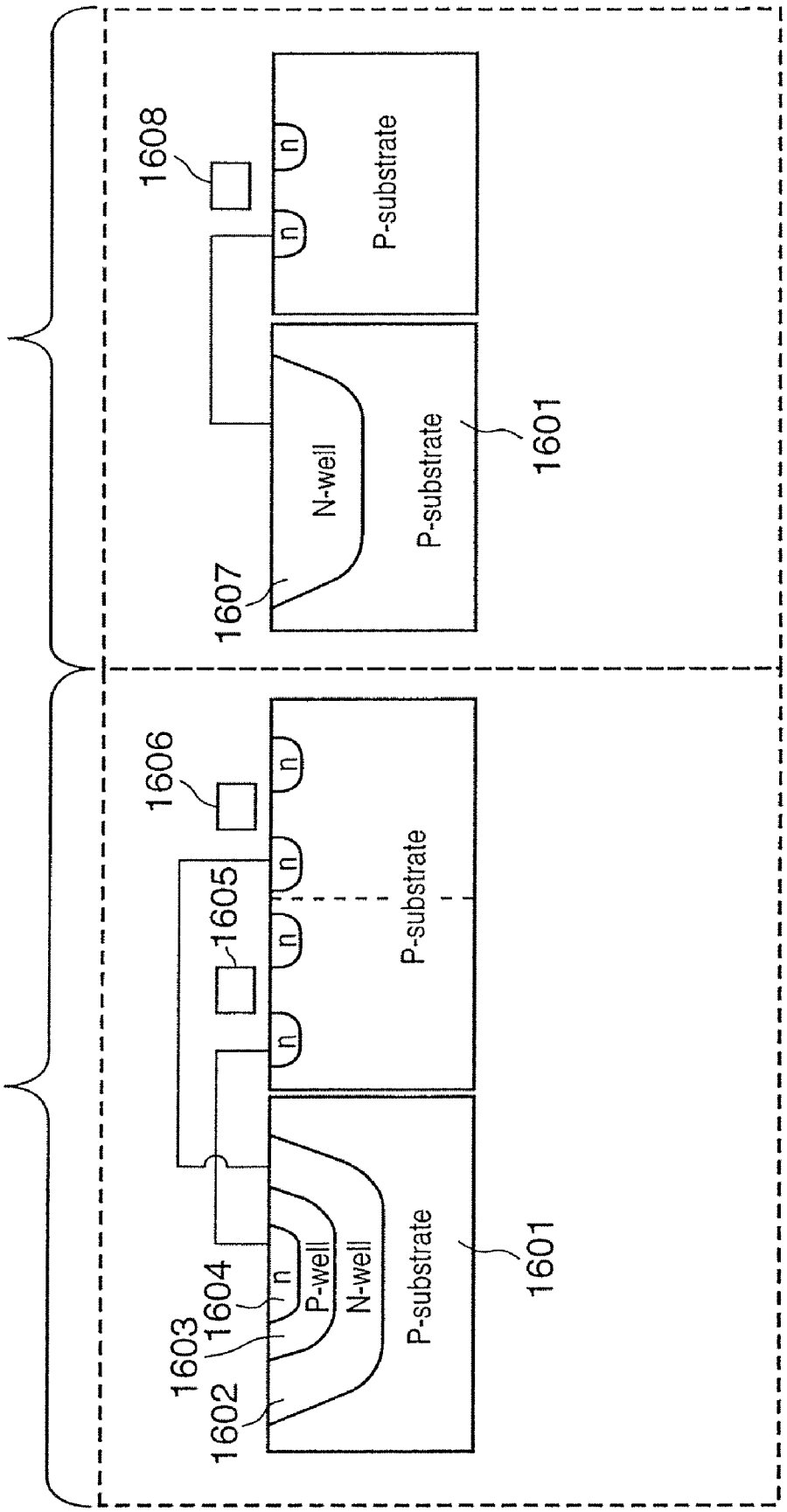

PHOTOELECTRIC CONVERSION UNIT STACKED STRUCTURE

RELATED APPLICATION INFORMATION

This application is a continuation of co-pending U.S. application Ser. No. 10/406,950 filed Apr. 3, 2003, which is incorporated herein by reference.

FIELD OF THE INVENTION

The present invention relates to the arrangement and control of a solid-state image sensing device prevalently used in an image input apparatus such as a video camera, digital still camera, or the like.

BACKGROUND OF THE INVENTION

In recent years, CMOS sensors as solid-state image sensing elements that use MOS transistors have been extensively developed. FIG. 1 is a schematic diagram of a CMOS sensor.

Reference numeral 1 denotes pixel circuits each of which has a photodiode used to convert light into an electrical signal, and a transistor. Such pixels line up in the horizontal and vertical directions to form a two-dimensional (2D) array. Reference numeral 2 denotes vertical output lines used to ouput signals from the pixels; 3, signal lines used to transfer voltages to transistors in the pixels; 4, a vertical scan circuit for outputting pulses in turn to the signal lines 3 in the vertical direction; 5, load transistors each of which forms a source-follower circuit with the transistor in each pixel; 6 a read circuit for reading noise signals and photoelectric conversion signals from the pixels; and 7, a differential amplifier for executing a differential process between the optical signal and noise signal.

FIG. 2 is a detailed equivalent circuit diagram of the pixel circuit 1 explained using FIG. 1. Reference numeral 21 denotes a photodiode which serves as a photoelectric conversion unit for converting light into an electrical signal; 22, an amplification transistor which receives a signal generated by the photodiode at its gate electrode, and amplifies and outputs that signal from its source electrode; 23, a transfer transistor which transfers the signal from the photodiode to the amplification transistor 22; 24, a reset transistor which supplies a reset potential to the gate electrode side (floating diffusion 26) of the amplification transistor; and 25, a selection transistor which selectively output a signal in the pixel onto the vertical output line.

The operation of the aforementioned CMOS sensor will be briefly explained below. The transfer transistor 23 and reset transistor 24 are turned on to reset the photodiode 21 and floating diffusion 26. After that, the transfer transistor 23 and reset transistor 24 are turned off, and the photodiode 21 starts accumulation of a photocharge.

During accumulation of the photocharge by the photodiode 21, the selection transistor 25 is turned on to read out a noise signal (a potential corresponding to that which resets the floating diffusion). After that, the transfer transistor 23 is turned on to transfer the photocharge to the floating diffusion, and a potential (photoelectric conversion signal) corresponding to that of the floating diffusion is read out.

The photoelectric conversion signal and noise signal are input to the differential amplifier 7 via the read circuit 6 to remove noise components contained in the input photoelectric conversion signal.

When the transfer transistor 26 is turned on, since it operates in a triode region (linear region), the source and drain sides are coupled via a channel, as shown in FIG. 3. FIG. 4 is a potential chart immediately after the gate of the transfer transistor 23 is enabled.

That is, as shown in FIG. 5, the photodiode 21 (electrostatic capacitance $C_{21}$) and floating diffusion 26 (electrostatic capacitance $C_{26}$) are capacitively coupled. Hence, if Vo represents a voltage generated by the photodiode 21, the voltage of the floating diffusion 26 is given by $\{C_{26}/(C_{21}+C_{26})\}$Vo due to capacitive division, and the voltage decreases, resulting in a sensitivity drop.

Upon resetting the photodiode, when the transfer transistor 23 operates in a triode region, the reset potential of the photodiode is influenced by variations of a threshold value of the transfer transistor 23, thus producing fixed pattern noise.

SUMMARY OF THE INVENTION

The present invention has as its object to provide a photoelectric conversion device, which has a plurality of pixel circuits, comprises a read transistor, a main electrode of which is connected to a charge accumulation node of a photoelectric conversion unit in each pixel circuit, and controls the read transistor to operate in a pentode region so as to read out a photoelectric conversion signal of each photodiode onto a floating diffusion.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 14A and 14B are circuit diagrams showing the arrangement of a pixel circuit corresponding to the fourth embodiment of the present invention;

FIGS. 15A and 15B are views showing the structure of a photodiode corresponding to the fourth embodiment of the present invention;

FIGS. 16A and 16B are views showing the structure of a photodiode corresponding to the fourth embodiment of the present invention;

DETAILED DESCRIPTION OF THE PREFERRED EMBODIMENTS

Preferred embodiments of the present invention will now be described in detail in accordance with the accompanying drawings.

First Embodiment

Figure 1:
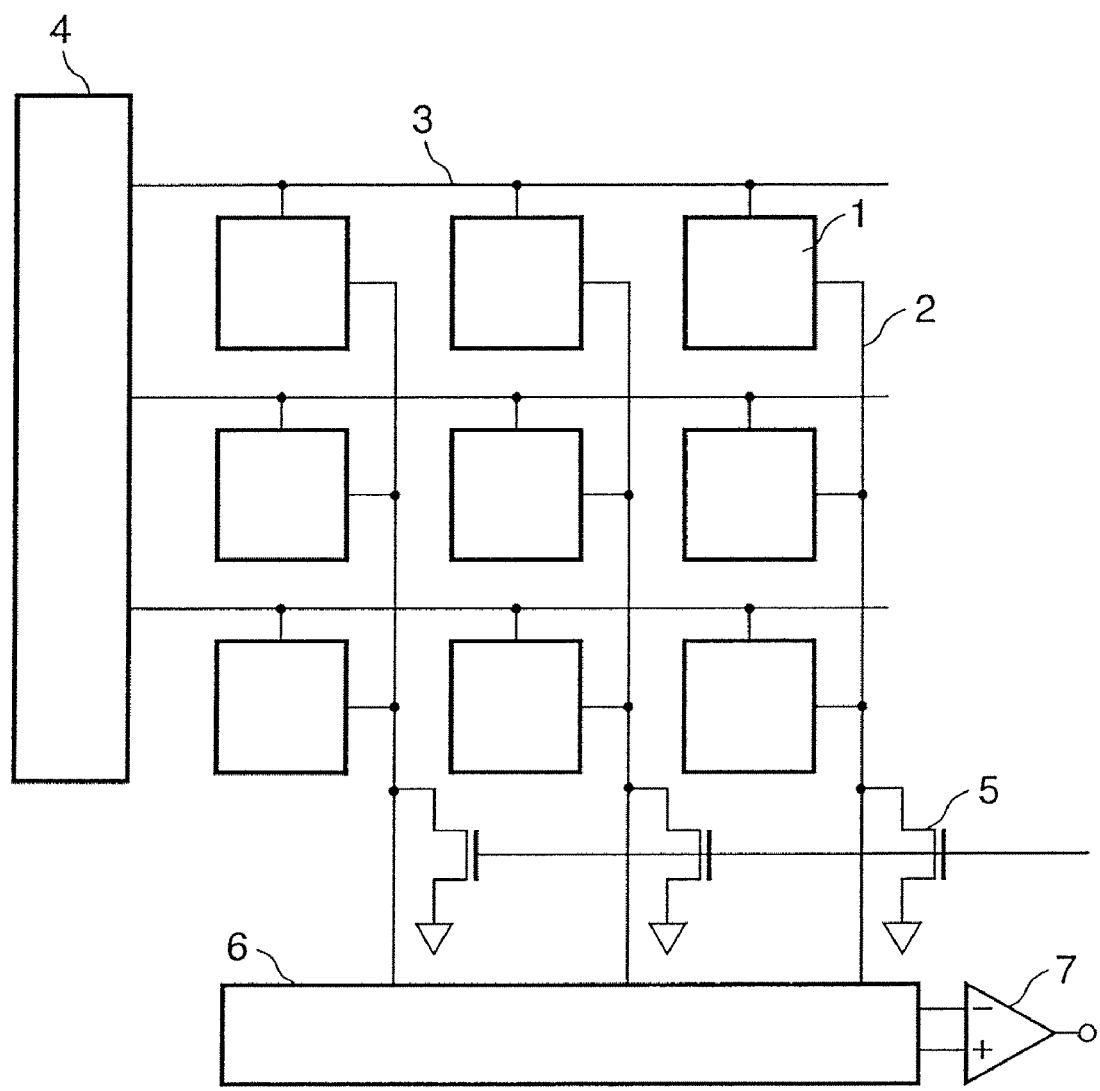
FIG. 1 is a schematic circuit diagram showing the arrangement of a CMOS sensor according to the present invention.
Figure 8:
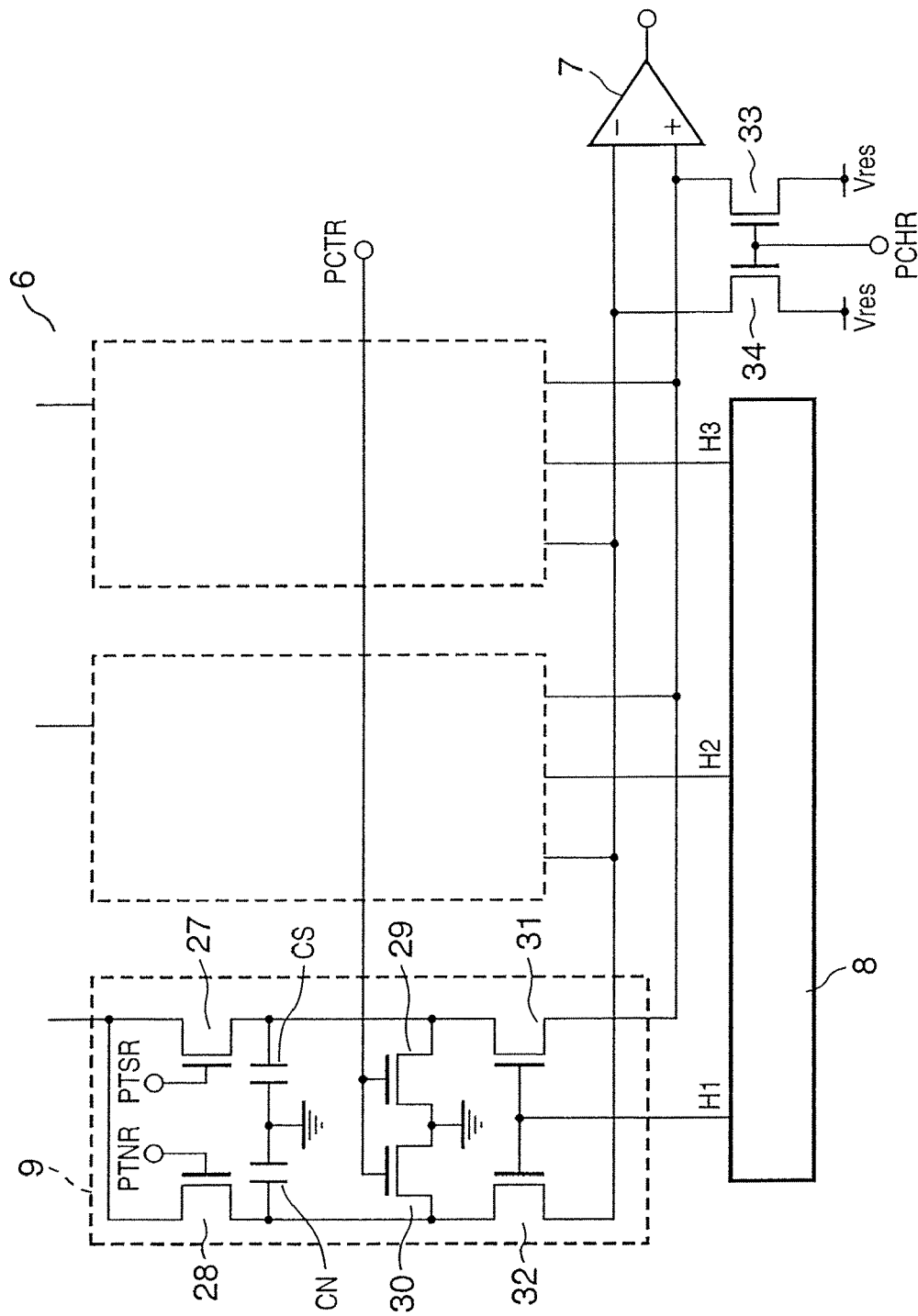
FIG. 8 is a circuit diagram showing the arrangement of a read block 6 in FIG. 1.

The arrangement of a CMOS sensor as a photoelectric conversion device corresponding to the first embodiment of the present invention is the same as that shown in FIG. 1. The arrangement of an equivalent circuit per pixel is the same as that shown in FIG. 2. In FIG. 1, the arrangement and detailed description of the read circuit 6 are omitted. FIG. 8 shows the detailed arrangement of the read circuit 6.

The arrangement of the read circuit 6 shown in FIG. 8 will be explained below. The read circuit 6 comprises circuit blocks 9, each of which is arranged for each pixel column, in correspondence with the number of columns in a pixel array. The outputs from these circuit blocks 9 are input to a differential amplifier 7. Each circuit block 9 comprises a capacitor CS for accumulating a photoelectric conversion signal, and a capacitor CN for accumulating a noise signal. These signals are accumulated when signals PTSR and PTNR input to transistors 27 and 28 change from Low to High.

The capacitors CS and CN are reset by transistors 29 and 30 and a signal PCTR as a pre-process for accumulating signal values. The potentials of the capacitors CS and CN are input to the differential amplifier 7 when transistors 31 and 32 are released in response to an output signal H1 from a horizontal scan circuit 8.

Figure 2:
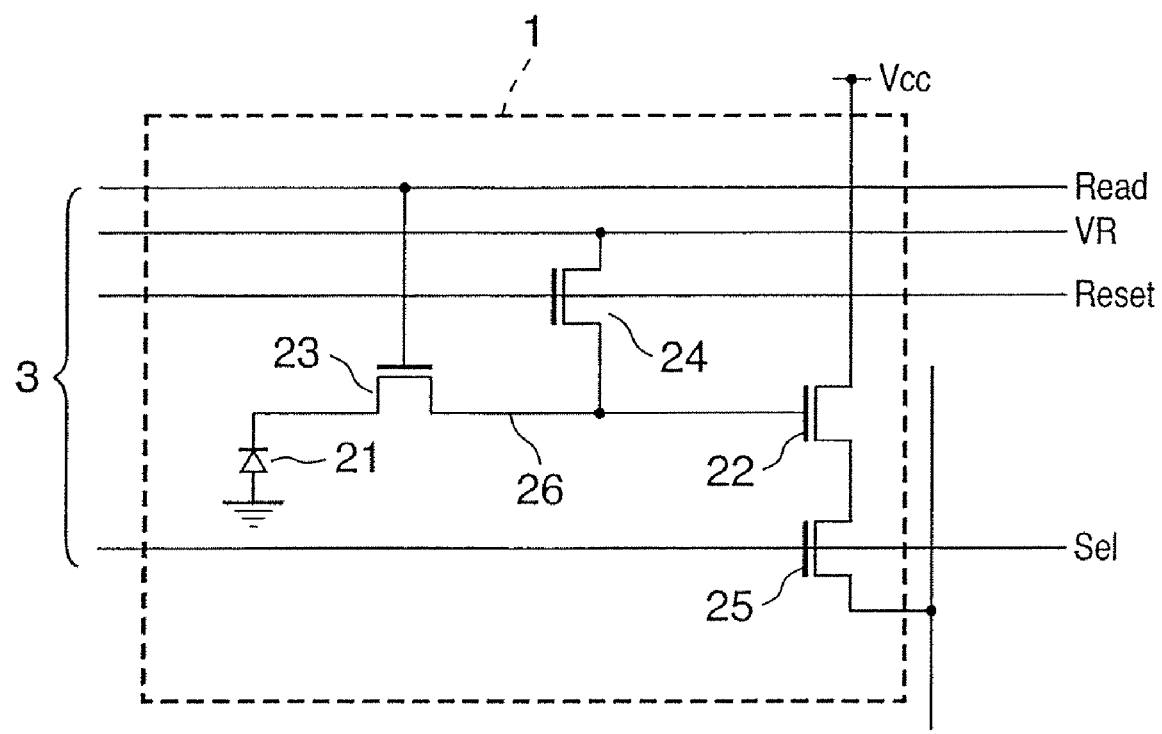
FIG. 2 is a circuit diagram showing the arrangement of a pixel circuit according to the present invention.
Figure 3:
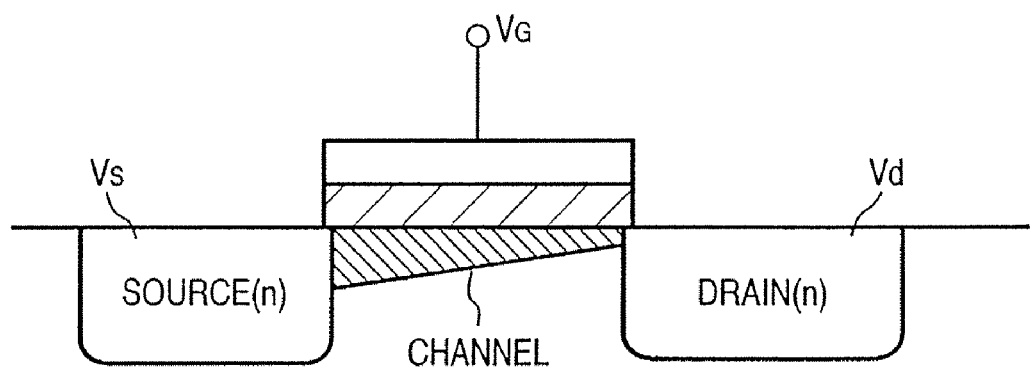
FIG. 3 is a view for explaining the operation of a transistor in a triode region.
Figure 4:
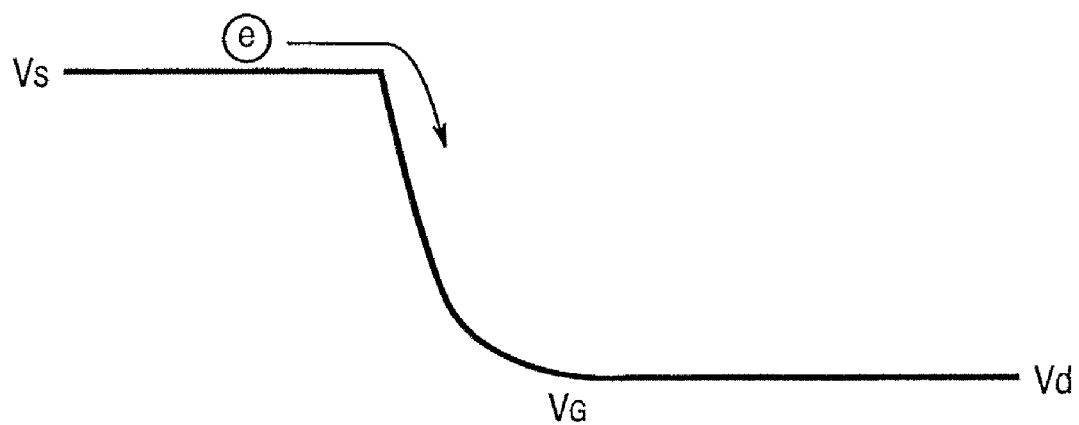
FIG. 4 is a potential chart upon operation of a transistor in a triode region.
Figure 5:
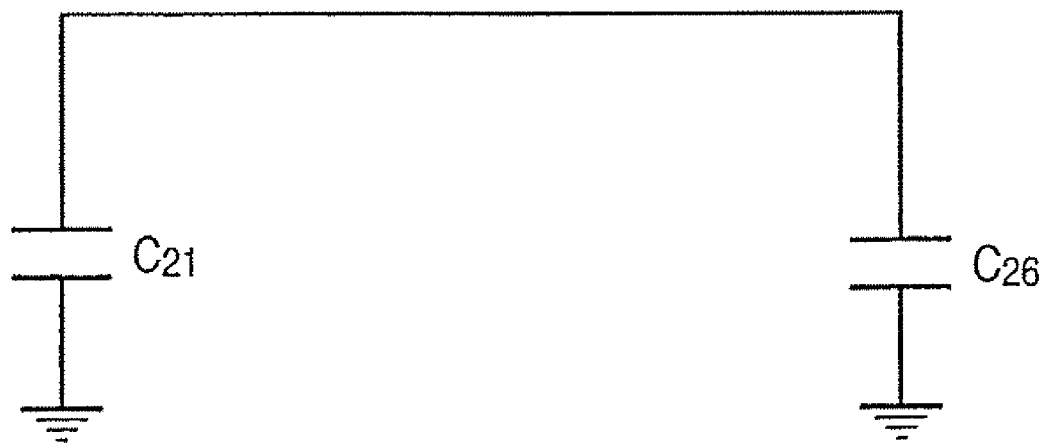
FIG. 5 is a diagram for explaining capacitive coupling generated upon operation of a transistor in a triode region.

The read process of signals from a pixel circuit 1 will be explained below with reference to FIG. 2. A selection transistor 25 is turned on to read out a noise signal (a potential corresponding to that resets a floating diffusion). After that, a transfer transistor 23 is turned on to transfer a photocharge to the floating diffusion, and a potential (photoelectric conversion signal) corresponding to that of the floating diffusion is read out.

In this manner, this embodiment adopts the arrangement of the conventional circuit, but control executed upon transferring the signal of a photodiode 21 as a photoelectric conversion unit to the floating diffusion 26, and that executed upon resetting the photodiode 21 are largely different from the conventional CMOS sensor.

Figure 6:
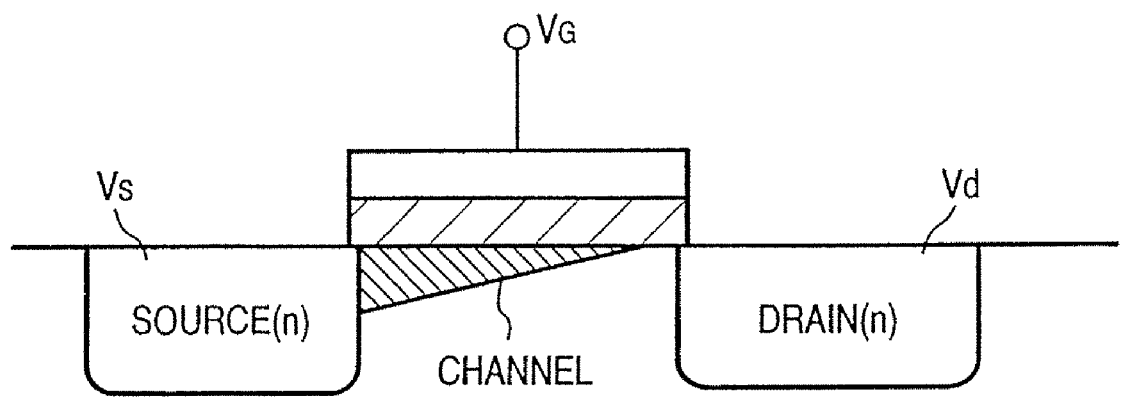
FIG. 6 is a view for explaining the operation of a transistor in a pentode region.

In this embodiment, the transfer transistor 23 operates in a pentode region (saturation region). That is, a gate voltage $V_g$, source voltage $V_s$, drain voltage $V_d$, and threshold voltage $V_{th}$ hold $V_g - V_s - V_{th} < V_d - V_s$. Upon operation in the pentode region, since a channel below the gate electrode does not reach the drain, as shown in FIG. 6, the photodiode 21 and floating diffusion 26 are not capacitively coupled, and do not undergo capacitive division unlike in the prior art. When the transfer transistor 23 operates in the pentode region upon resetting, since the reset voltage is determined by the gate voltage and the threshold value of the transfer transistor, the reset potential is set at a level unique to the transfer transistor.

Figure 7:
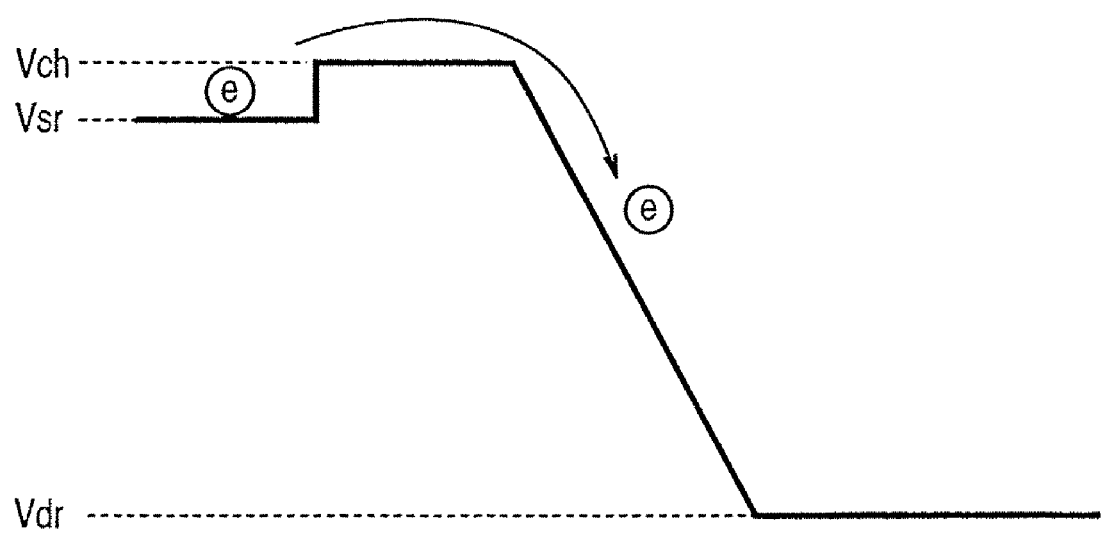
FIG. 7 is a potential chart upon operation of a transistor in a pentode region.

Referring to the potential chart in FIG. 7 at that time, since the gate voltage is input at a level that does not completely reach High (e.g., 5 V), the potential of the gate region never drops from a level Vch, and a potential barrier is generated. Of charge components on the source side of the transfer transistor, which are generated by the photodiode, charge components which have higher energy flow into the drain side of the transfer transistor, i.e., the floating diffusion beyond the potential barrier. In this manner, since charge components of the photodiode 21 can be read out to the floating diffusion without any capacitive division, reset noise of the photodiode can also be reduced.

The operation will be described in more detail below. The gate potential of the transfer transistor 23 is slightly higher than the sum of the reset potential of the photodiode 21 and the threshold voltage of the NMOS transistor 23. The channel potential at this time is Vch shown in FIG. 7, thus generating a potential barrier.

The potential of the floating diffusion is fixed at a potential upon resetting by a reset transistor 24. This potential is set to be sufficiently higher than the reset potential of the photodiode to allow the transfer transistor 23 to operate in the pentode region. In FIG. 7, this potential is indicated by Vdr.

Upon resetting the photodiode 21, a saturation current or sub-threshold value current flows in the transfer transistor 23, and the source potential of the NMOS transistor 23 becomes closer to a potential (Vsr in FIG. 7) determined by the gate voltage and threshold voltage value of the transfer transistor 23. When a signal output begins, the potential on the source side of the transfer transistor 23 is about to be pushed up by a signal voltage via the capacitance of the photodiode 21, but returns to Vsr by a current that flows through the transfer transistor 23.

Hence, only signal charge components which do not contain those for a reset level determined by the capacitance of the photodiode and signal voltage component are accumulated on the floating diffusion 26.

Figure 9:
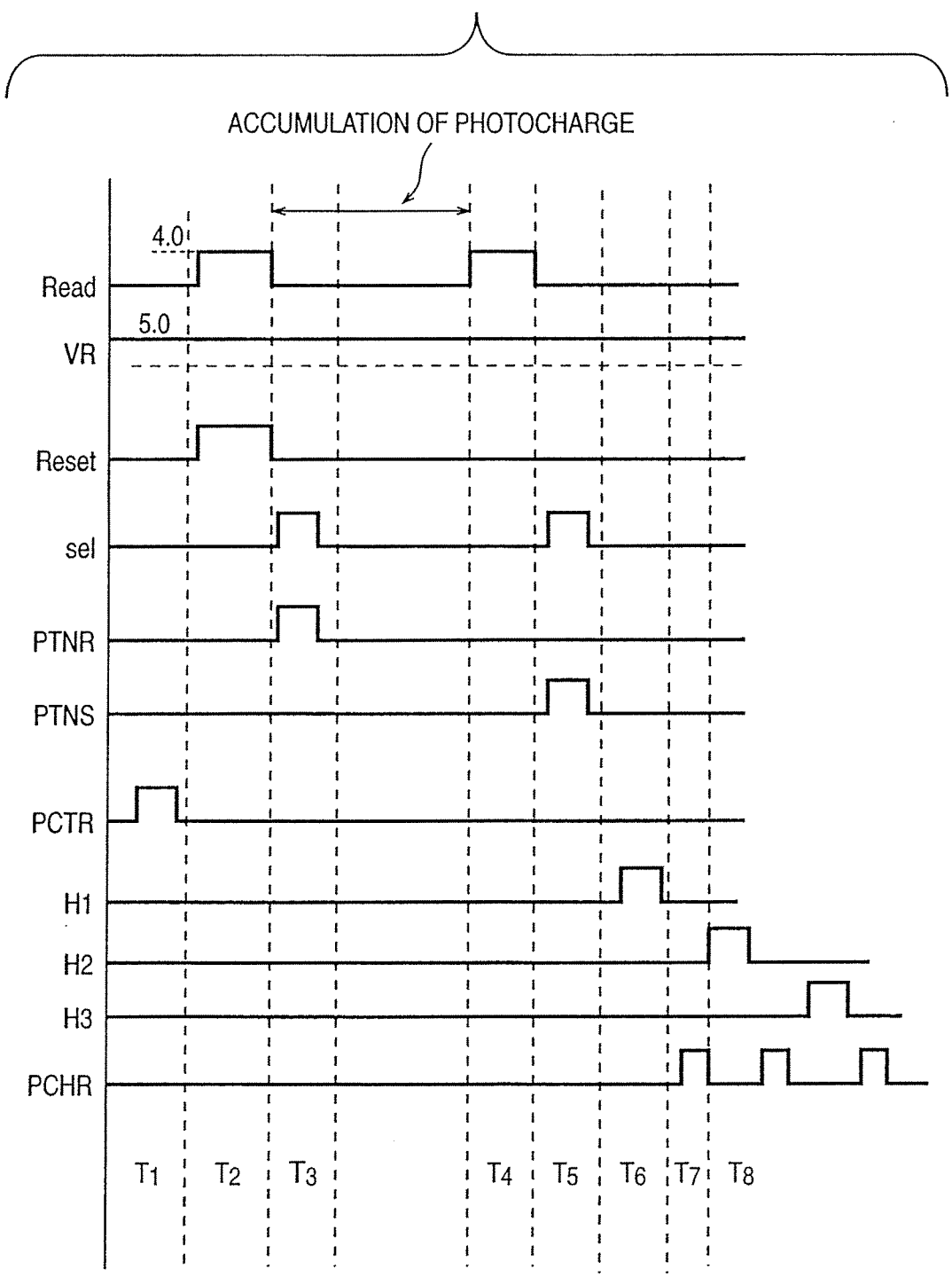
FIG. 9 is a timing chart of control signals corresponding to the first embodiment of the present invention.

FIG. 9 is a timing chart showing the operation of the sensor shown in FIG. 8. At T1, the capacitors CS and CN are reset. At T2, the transfer transistor 23 is operated in the pentode region to reset the photodiode. A gate voltage required to operate the transfer transistor 23 in the pentode region is set at 4.0 V in this embodiment. If the threshold value voltage of the transfer transistor 23 is, e.g., 0.3 V, the reset potential of the photodiode 21 is 3.5 V. Note that these numerical values are merely examples, and the present invention is not limited to these specific values. At this time, a Reset signal changes to High (5 V) to also reset the floating diffusion 26.

At T3, the selection transistor 25 is turned on in response to a signal sel, and a signal PTNR is enabled at the same time. Hence, a noise signal produced upon resetting is transferred to the capacitor CN. At T4, the transfer transistor 23 is operated in the pentode region to transfer a charge generated by the photodiode to the floating diffusion 26.

Furthermore, at T5, the selection transistor 25 is turned on in response to the signal sel, and a signal PTNS is enabled at the same time. Hence, a photoelectric conversion signal (noise signal+a signal based on a charge generated by the photodiode) is transferred to the capacitor CS. At T6, a switch transistor noise signal and the photoelectric conversion signal are output onto a horizontal output line in response to an output signal Hl from the horizontal shift register (horizontal scan circuit) 8, and are input to the differential amplifier 7. At T7, the horizontal output line is reset. At T8, a noise signal and photoelectric conversion signal for one line are output onto the horizontal output line.

Second Embodiment

Figure 10:
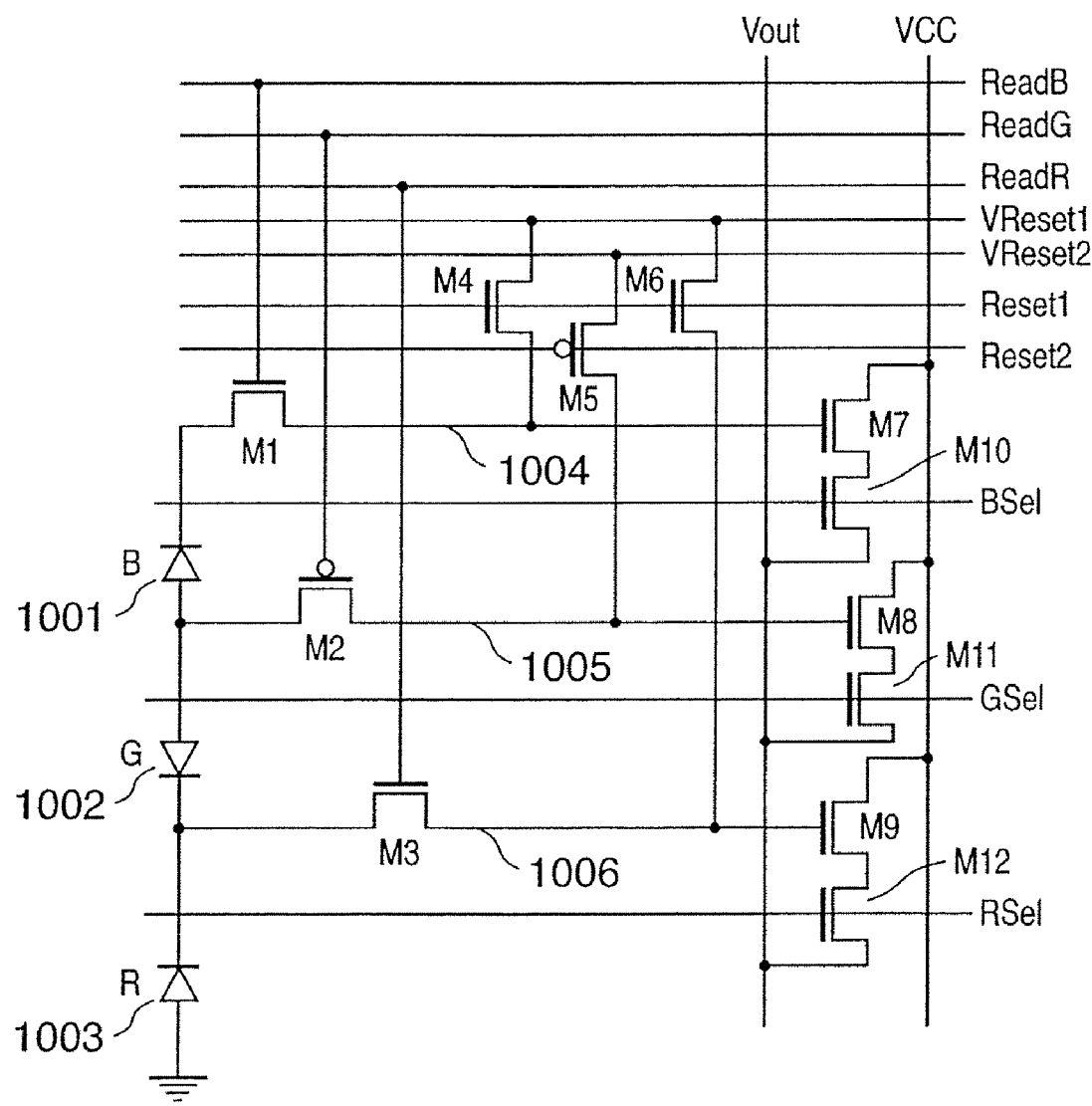
FIG. 10 is a circuit diagram showing the arrangement of a pixel circuit corresponding to the second embodiment of the present invention.
Figure 11:
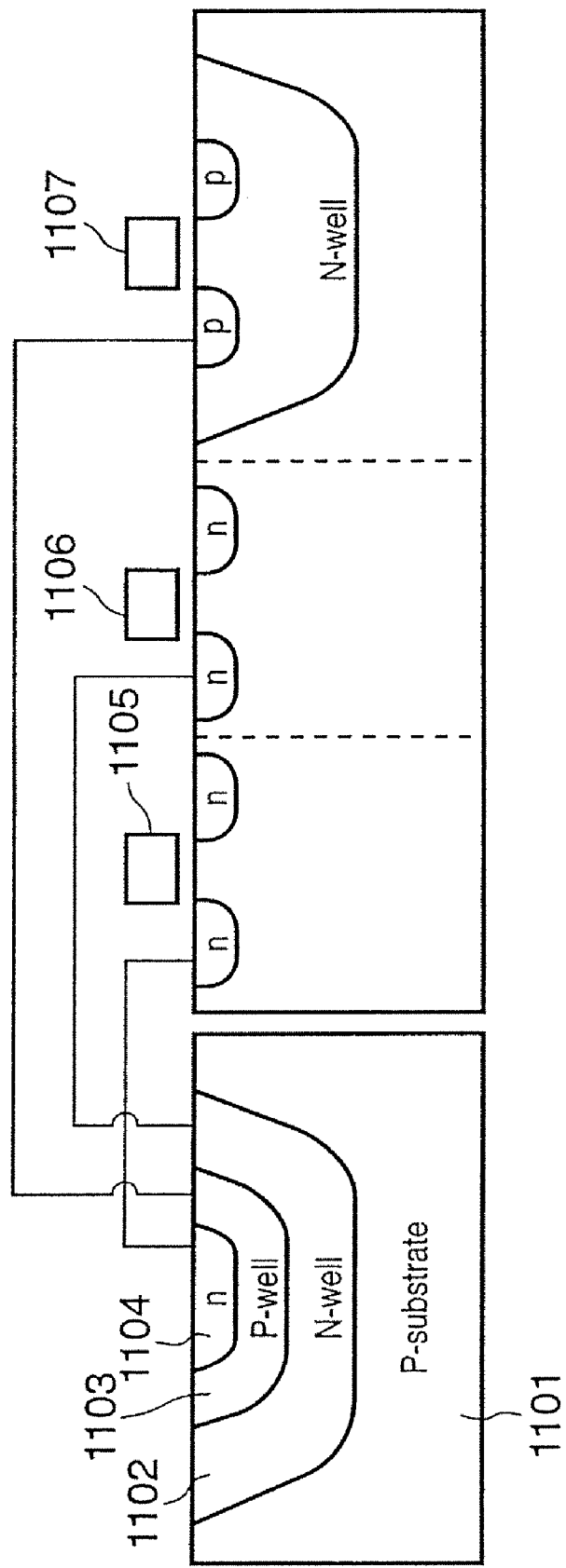
FIG. 11 is a view showing the structure of a photodiode corresponding to the second embodiment of the present invention.

In this embodiment, the CMOS sensor shown in FIG. 1 adopts an arrangement shown in FIG. 10 as a pixel circuit 1. FIG. 10 shows the circuit arrangement for one pixel, which comprises a three-layered photodiode. This three-layered photodiode is formed to have a tripe-well structure, as shown in FIG. 11. Referring to FIG. 11, reference numeral 1101 denotes a p-silicon substrate; 1102, an n-well formed on the silicon substrate 1101; 1103, a p-well formed on the n-well 1102; and 1104, an n-type region. Reference numerals 1105 and 1106 denote NMOS transistors respectively used to transfer B and R signals; and 1107, a PMOS transistor used to transfer a G signal.

As shown in FIG. 11, in the photodiode, three layers of pn-junction diodes are formed in the depth direction of silicon by deeply forming an n-type layer, p-type layer, and n-type layer in the order named, which are diffused in turn from the surface of the p-type silicon substrate. Light components which have entered the diode from the surface side intrude deeper as they have longer wavelengths, and the incoming wavelength and attenuation coefficient exhibit values unique to silicon. Hence, the depths of pn-junctions of the photodiode with the three-layered structure are designed to cover respective wavelength ranges (R, G, B) of visible light, and currents are independently detected from three layers of the photodiode, thus detecting photo signals of different wavelength ranges.

In this embodiment, in the pixel circuit that adopts the three-layered photodiode structure shown in FIG. 11, when signals from R, G, and B photodiodes 1001, 1002, and 1003 are transferred to floating diffusions 1004, 1005, and 1006, and when the photodiodes 1001, 1002, and 1003 are reset, transfer transistors Ml, M2, and M3 are operated in the pentode region, as in the first embodiment. The read circuit 6 in FIG. 1 can comprise circuit blocks 9 in FIG. 8 of the first embodiment in correspondence with signals to be read out from the R, G, and B photodiodes. Upon switching inputs to the respective circuit blocks 9, signals PTNS and PTNR can be used in correspondence with signals Rsel, Bsel, and Gsel as in the first embodiment.

The circuit arrangement which comprises the capacitors CN and CS and transistors 27 and 28 and accumulates a noise signal and photoelectric conversion signal is arranged for each of R, G, and B colors. Noise signals and photoelectric conversion signals corresponding to the photodiodes of respective colors are accumulated on the corresponding capacitors CS and CN by selection transistors M10, M11, and M12, and signals Bsel, Gsel, and Rsel used to control these transistors.

Figure 12:
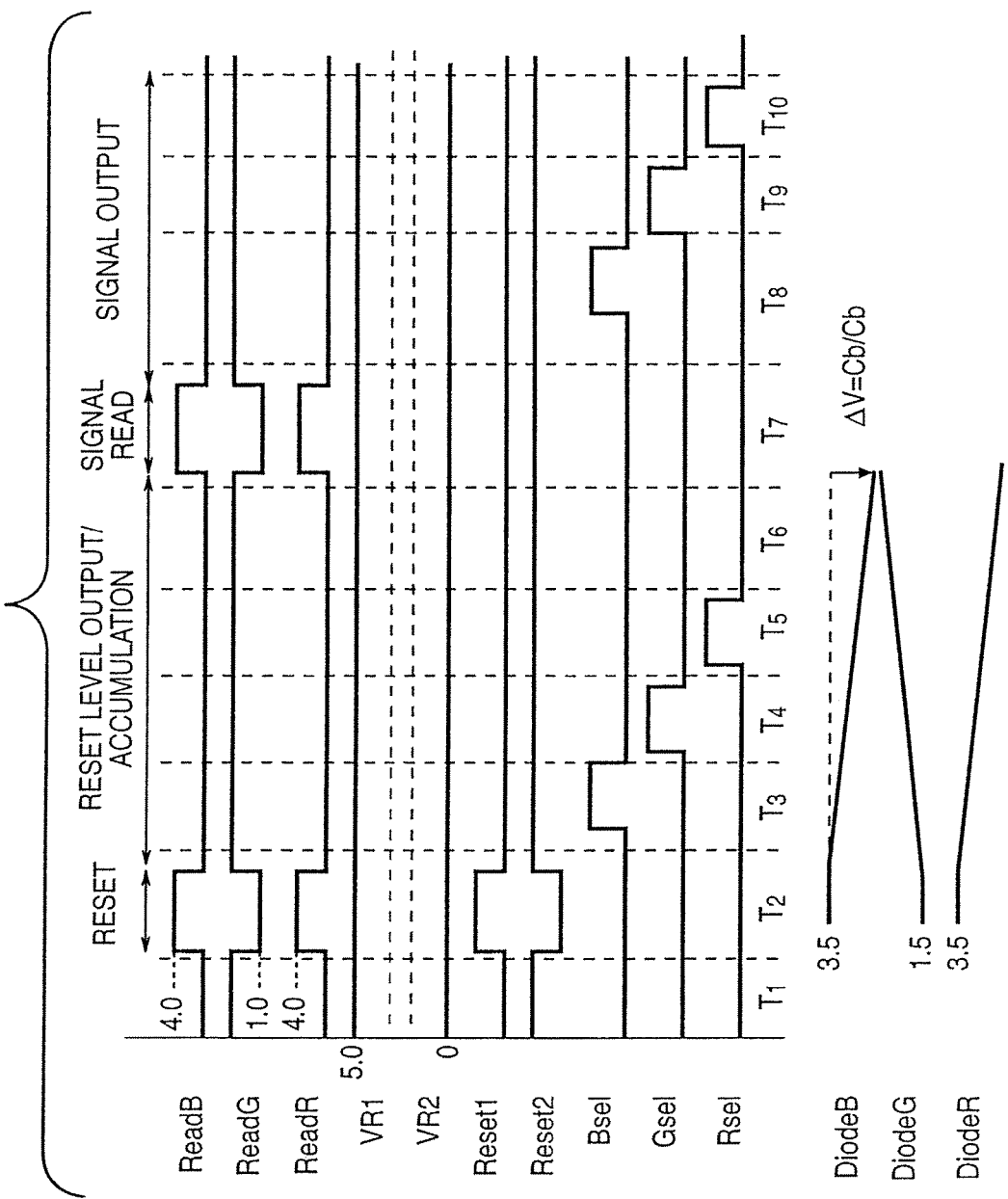
FIG. 12 is a timing chart of control signals corresponding to the second embodiment of the present invention.

FIG. 12 is a timing chart showing the operation of the sensor shown in FIG. 10. FIG. 12 is a chart of control signals in the pixel circuit 1 for the sake of simplicity. As for the control in the read circuit 6, since the control in the first embodiment need only be repeated in correspondence with three colors, a description thereof except for that which will be specified in the following description will be omitted while quoting the first embodiment.

At T1, the transfer transistor is operated in the pentode region to reset the photodiode. At the same time, the floating diffusion is reset. A signal Reset1 is a positive input (5 V) for B and R signals, since reset transistors M4 and M6 are NMOS transistors. However, a signal Reset2 is a negative input (0 V) for a G signal since a reset transistor M5 is a PMOS transistor. Likewise, signals ReadB and ReadR are positive inputs, and a signal ReadG is a negative input. The potentials of the signals ReadB and ReadR upon resetting can be set at 4.0 V as in the first embodiment. On the other hand, the potential of the signal ReadG at that time is 1.0 V. Note that the capacitors CS and CN corresponding to respective colors are reset before T1 as in the first embodiment.

The reset potentials of the photodiodes of the respective colors are 3.5 V for B and R, and 1.5 V for G, as shown in, e.g., the lower portion of FIG. 12. These potentials decrease for B and R and increase for G as the accumulation time elapses.

At T2, the selection transistor M10 is enabled by the signal Bsel for a B signal, and a noise signal produced upon resetting is transferred to the capacitor CN. At T3 and T4, the operation at T2 is executed for G and R signals.

After the reset operations, predetermined periods are given as accumulation periods of pixel values (from T3 to T6).

After T6, a signal read operation starts at T7. In this case, the transfer transistors Ml, M2, and M3 are operated in the pentode region, and charges generated by the photodiodes of respective colors are transferred to the floating diffusions 1004, 1005, and 1006.

Upon completion of the signal read processes, photoelectric conversion signals (noise signals+signals based on charges generated by the photodiodes) are transferred to the capacitors CS corresponding to respective colors in response to signals Bsel, Gsel, and Rsel at T8 to T10. After that, the operations at T6 and subsequent timings in the first embodiment are executed for respective colors.

In this way, since the transfer transistors are operated in the pentode region in the pixel circuit that adopts the three-layered photodiode structure, photodiode signals do not undergo any capacitive division by the photodiode and floating diffusion capacitances. Hence, color separation can be implemented without any gain correction, thus improving color reproducibility. Also, as in the first embodiment, reset noise of each photodiode can be removed.

Third Embodiment

Figure 13:
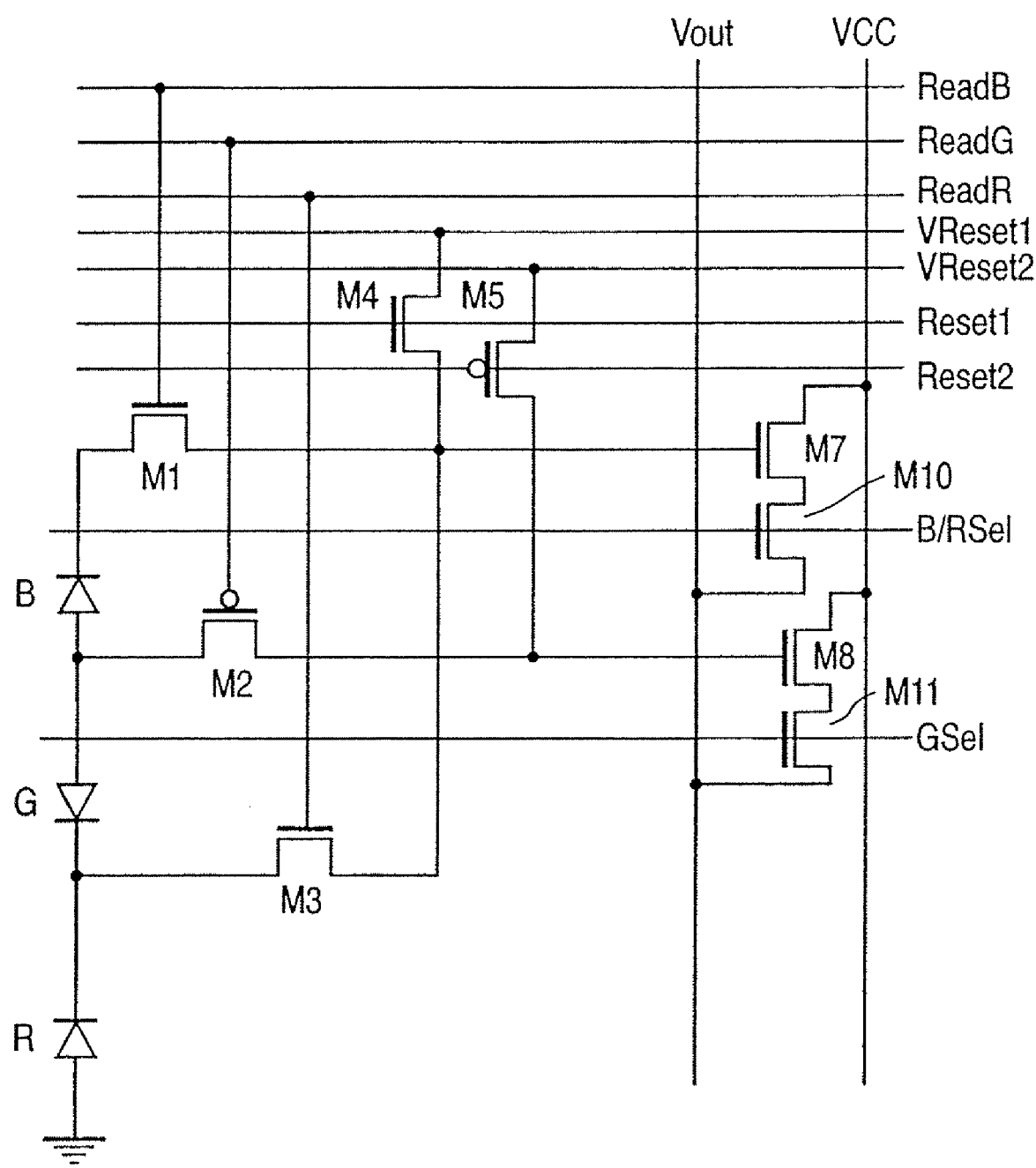
FIG. 13 is a circuit diagram showing the arrangement of a pixel circuit corresponding to the third embodiment of the present invention.

In this embodiment, the CMOS sensor shown in FIG. 1 adopts an arrangement shown in FIG. 13 as a pixel circuit 1. FIG. 13 shows the circuit arrangement for one pixel, which comprises a three-layered photodiode, as in the second embodiment shown in FIG. 10. In this embodiment, however, the circuit scale can be reduced by commonly using reset transistors, amplification transistors, and selection transistors for B and R signals as single transistors M4, M7, and M10.

The control of the pixel circuit 1 in this embodiment is substantially the same as that in the timing chart shown in FIG. 12. However, since B and R signals cannot simultaneously use the floating diffusion, the control for the B signal must be repeated for the R signal. That is, the control from the reset operation until the reset level output of the R signal must be executed upon completion of the reset level output control of the B signal. Also, upon reading out signals, the read control of the R signal starts upon completion of the read & signal output control of the B signal.

Fourth Embodiment

In this embodiment, the CMOS sensor shown in FIG. 1 adopts an arrangement shown in FIGS. 14A and 14B as a pixel circuit 1. FIGS. 14A and 14B show the circuit arrangement for one pixel, which comprises a three-layered photodiode, as in the third embodiment, except that a pixel circuit for B and R signals, and a pixel circuit dedicated to a G signal are independently arranged. With this arrangement, the circuit scale per pixel can be reduced, and the aperture area of each photodiode can be increased.

Note that the pixel circuit for B and R signals shown in FIG. 14A has an arrangement obtained by excluding transistors M2, MS, M8, and M11 for a G signal in FIG. 13. On the other hand, the pixel circuit for a G signal shown in FIG. 14B has an arrangement obtained by excluding transistors M1, M3, M4, M7, and M10 for a B (R) signal in FIG. 13. An n-type layer of the photodiode for B and R signals is connected to a voltage source Vcc.

The photodiode shown in FIGS. 14A and 14B has a structure, as shown in FIGS. 15A and 15B. FIG. 15A shows a pixel structure used to read out B and R signals, and FIG. 15B shows a pixel structure used to read out a G signal. In this way, the photodiode structure can be commonly used in respective pixel circuits. In FIG. 15B, reset, read, and selection transistors may comprise PMOS transistors.

The photodiode shown in FIGS. 14A and 14B may have a structure shown in, e.g., FIGS. 16A and 16B, in place of the structure shown in FIGS. 15A and 15B. Note that the structure in FIG. 16A is the same as that in FIG. 15A. However, FIG. 16B shows a single-layered structure of a photodiode, and respective transistors in a pixel can comprise NMOS transistors. In this way, the area of the pixel circuit itself can be reduced while maintaining a large aperture area of the photodiode, compared to FIG. 15B. However, the arrangement shown in FIG. 16B requires a color filter used to detect a G signal alone.

Figure 17:
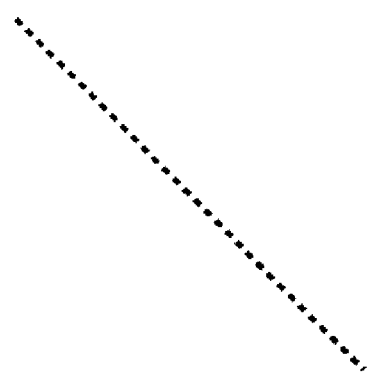
FIG. 17 is a view showing an example of a layout of pixel circuits corresponding to the fourth embodiment of the present invention.

In this embodiment, pixel circuits are laid out, as shown in FIG. 17. Note that the pixel circuit for a G signal in FIG. 14B is laid out in "G" blocks, and the pixel circuit for a B/R signal in FIG. 14A is laid out in "B/R" blocks.

The signal read control from the pixel circuits in this embodiment is substantially the same as that in the third embodiment.

Fifth Embodiment

An image sensing system which uses the photoelectric conversion device of the present invention that has been explained in the first to fourth embodiments will be described below with reference to FIG. 18.

Figure 18:
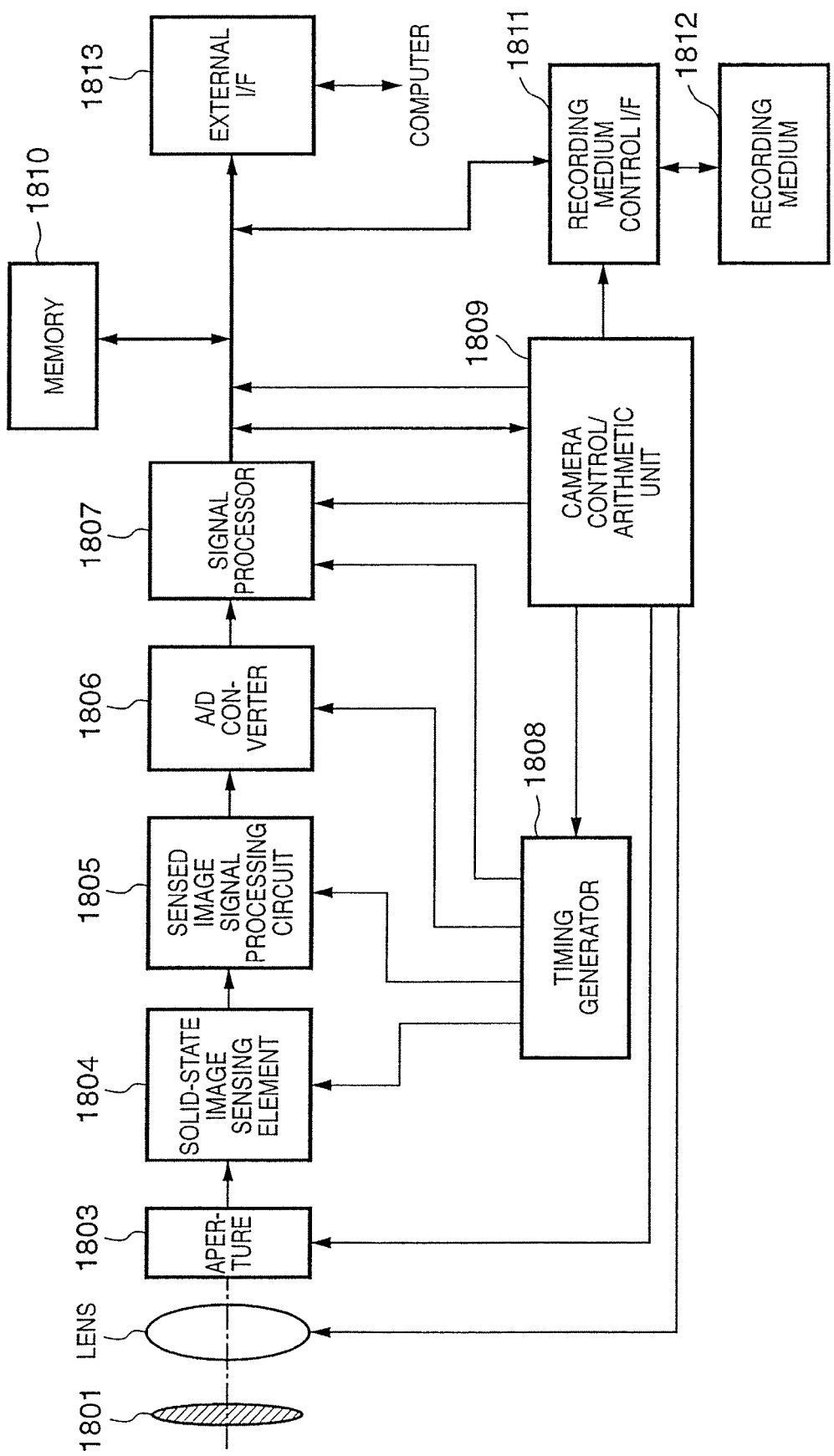
FIG. 18 is a block diagram showing the arrangement of an image sensing system according to the fifth embodiment of the present invention.

Referring to FIG. 18, reference numeral 1801 denotes a barrier which serves as both a lens protection member and a main switch; 1802, a lens which forms an optical image of an object on an image sensing device 1804; 1803, an aperture used to variably control the amount of light that has passed through the lens 1802; 1804, a solid-state image sensing element (corresponding to the photoelectric conversion device explained in the first to fourth embodiments) which captures as an image signal the optical image of the object formed by the lens 1802; 1805, a sensed image signal processing circuit which includes a variable gain amplifier for amplifying an image signal output from the image sensing device 1804, a gain correction circuit for correcting gain values, and the like; 1806, an analog-to-digital (A/D) converter which A/D-converts the image signal output from the image sensing device 1804; 1807, a signal processor which makes various correction processes of image data output from the A/D converter 1806, and compresses the data; 1808, a timing generator which outputs various timing signals to the image sensing device 1804, sensed image signal processing circuit 1805, A/D converter 1806, and signal processor 1807; 1809, a camera control/arithmetic unit which makes various arithmetic operations, and controls the entire still video camera; 1810, a memory which temporarily stores image data; 1811, a recording medium control interface which is used to record/read out data on/from a recording medium; 1812, a detachable recording medium such as a semiconductor memory or the like on/from which image data is recorded/read out; and 1813, an interface which is used to communicate with an external computer or the like.

The operation of the still video camera upon image sensing in the above arrangement will be explained below.

When the barrier 1801 is opened, a main power supply is turned on, a power supply for a control system is then turned on, and a power supply for image sensing system circuits including the A/D converter 1806 and the like is then turned on.

After that, in order to control an exposure value, the camera control/arithmetic unit 1809 fully opens the aperture 1803, and a signal output from the solid-state image sensing element 1804 is converted by the A/D converter 1806 and is then input to the signal processor 1807. The camera control/arithmetic unit 1809 makes photometry on the basis of data which has undergone a predetermined signal process by the signal processor 1807, determines brightness based on the photometry result, and calculates an exposure value. Then, the unit 1809 controls the aperture 1803 in accordance with the obtained exposure value.

The camera control/arithmetic unit 1809 then calculates the distance to an object by extracting high-frequency components on the basis of the signal output from the image sensing device 1804. The unit 1809 drives the lens to see if an in-focus state is attained. If it is determined that an in-focus state is not attained, the unit 1809 drives the lens again to measure the distance. After an in-focus state is confirmed, the unit 1809 starts main exposure.

Upon completion of exposure, an image signal output from the image sensing device 1804 is A/D-converted by the A/D converter 1806, and digital image data is written in the memory 1810 via the signal processor 1807 under the control of the camera control/arithmetic unit 1809.

After that, the data stored in the memory 1810 is recorded on the detachable recording medium 1812 such as a semiconductor memory or the like via the recording medium control I/F 1811 under the control of the camera control/arithmetic unit 1809.

Also, image data may be directly input to a computer or the like via the external I/F 1813 to process an image.

As described above, according to each of the embodiments of the present invention, since the transfer transistor in the pixel circuit is operated in the pentode region, the photodiode and floating diffusion are not capacitively coupled and do not undergo capacitive division, thus suppressing a decrease in voltage on the floating diffusion, and preventing a sensitivity drop. Since a charge on the photodiode can be read out to the floating diffusion without undergoing capacitive division, reset noise of the photodiode can also be removed.

In the pixel circuit which adopts the three-layered photodiode structure, since the transfer transistor is operated in the pentode region, photodiode signals do not undergo any capacitive division by the photodiode and floating diffusion capacitances. Hence, color separation can be implemented without any gain correction, thus improving color reproducibility.

As described above, according to the present invention, a high-quality image can be obtained.

As many apparently widely different embodiments of the present invention can be made without departing from the spirit and scope thereof, it is to be understood that the invention is not limited to the specific embodiments thereof except as defined in the claims.

What is claimed is:

1. A photoelectric conversion device comprising an array of a plurality of pixels, each of which has:

a plurality of photoelectric conversion units stacked in a depth direction;

reset transistors of said plurality of photoelectric conversion units;

floating diffusions for holding output charges from said plurality of photoelectric conversion units;

amplification transistors for detecting potentials of said floating diffusions; and a plurality of read transistors, a first main electrode of each of which is connected to a charge accumulation node of each photoelectric conversion unit, and which are operated in a pentode region to read out photoelectric conversion signals from said plurality of photoelectric conversion units to said floating diffusions, wherein, each photoelectric conversion unit comprises a first conductive type semiconductor area and a second conductive type semiconductor area stacked on each other, and said plurality of pixels includes a first pixel and a second pixel, wherein the photoelectric conversion unit of the first pixel comprises a first semiconductor area of the first conductive type, a second semiconductor area of the second conductive type under the first semiconductor area, a third semiconductor area of the first conductive type under the second semiconductor area, and a fourth semiconductor area of the second conductive type under the third semiconductor area, the photoelectric conversion unit of the second pixel comprises a fifth semiconductor area of the first conductive type, and a sixth semiconductor area of the second conductive type under the fifth semiconductor area, an output signal corresponding to blue light is read out from the first semiconductor area of the photoelectric conversion unit of the first pixel, an output signal corresponding to red light is read out from the third semiconductor area of the photoelectric conversion unit of the first pixel, and an output signal corresponding to green light is read out from the fifth semiconductor area of the photoelectric conversion unit of the second pixel, and a color filter is arranged for the second pixel.

2. The device according to claim 1, wherein second main electrodes of said read transistors are at least partially commonly connected.

3. The device according to claim 1, wherein in each of the first and second pixels, charges accumulated on the photoelectric conversion units have an identical polarity.

4. An image sensing system using a photoelectric conversion device of claim 1.

* * * * *